(12) United States Patent
Hagerty

(10) Patent No.: US 8,686,715 B1
(45) Date of Patent: Apr. 1, 2014

(54) IMPEDANCE COMPENSATION METHOD FOR GIANT MAGNETO-IMPEDANCE MAGNETIC SENSORS TO NULL OUT THE TERRESTRIAL RESIDUAL MAGNETIC FIELD

(75) Inventor: James D. Hagerty, Tiverton, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 402 days.

(21) Appl. No.: 13/373,250

(22) Filed: Oct. 31, 2011

(51) Int. Cl.
  *G01R 33/02* (2006.01)
(52) U.S. Cl.
  CPC ..................... *G01R 33/02* (2013.01)
  USPC ......... 324/123 R; 324/202; 324/225; 324/260
(58) Field of Classification Search
  CPC ....... G01R 33/02; G01R 33/09; G01R 33/093
  USPC .............. 324/228–260, 202, 225, 262, 207.2,
      324/207.11, 207.12, 207.13, 207.14,
      324/207.15, 207.16, 207.17, 207.18,
      324/207.21, 207.22, 207.23, 207.24,
      324/207.25, 207.26; 33/272, 319, 352,
      33/355 R, 356, 357; 338/32 R, 32 H;
      327/510, 511
  See application file for complete search history.

(56) References Cited

U.S. PATENT DOCUMENTS

| | | | |
|---|---|---|---|
| 7,119,533 B2 * | 10/2006 | Tamura et al. | 324/202 |
| 7,123,016 B2 * | 10/2006 | Larsen | 324/326 |
| 2011/0152703 A1 * | 6/2011 | Zuckerman et al. | 600/508 |

* cited by examiner

*Primary Examiner* — Arleen M Vazquez
*Assistant Examiner* — Robert P Alejnikov, Jr.
(74) *Attorney, Agent, or Firm* — James M. Kasischke; Jean-Paul A. Nasser; Michael P. Stanley

(57) ABSTRACT

The invention is a method, described with the appropriate auxiliary electronic circuitry, for compensating the effect of the earth's magnetic field on Giant Magneto-Impedance magnetic sensors. The method as taught is an alternate way of cancelling out the effect of the very large residual earth's magnetic field using an impedance-tuning circuit (i.e. electrical compensation) rather than the usual magnetic type of compensation.

11 Claims, 4 Drawing Sheets

IMPEDANCE COMPENSATION METHOD FOR GIANT MAGNETO-IMPEDANCE MAGNETIC SENSORS TO NULL OUT THE TERRESTRIAL RESIDUAL MAGNETIC FIELD

STATEMENT OF GOVERNMENT INTEREST

The invention described herein may be manufactured and used by or for the Government of the United States of America for governmental purposes without the payment of any royalties thereon or therefore.

CROSS REFERENCE TO OTHER RELATED APPLICATIONS

Not applicable.

BACKGROUND OF THE INVENTION (1) Field of the Invention

The present invention relates to magnetic field sensors, and more specifically to a method that with the appropriate auxiliary electronic circuitry can compensate the effect of the earth's magnetic field on Giant Magneto-Impedance magnetic sensors.

(2) Description of the Prior Art

If a soft magnetic conductor is driven by a high-frequency (typically radio frequency) current, and then undergoes an applied changing magnetic field, the resultant electrical impedance change of the conductor (which is often significant) is called the Giant Magneto-Impedance effect. Small diameter amorphous metal wires (called fibers, because of their small cross-sectional area) give the strongest Giant Magneto-Impedance effect.

Extremely sensitive magnetic sensors can be constructed with these fibers and they are presently being used (for example) for micro-magnetic recording heads, magnetic anomaly detection, robotic and automotive control, and industrial and environmental measurement. To be effective, however, magnetic sensors need to compensate for the earth's residual magnetic field, (also referred to as the geo-field or static geo-field), which can be as large as +/−60,000 nanoTesla (nT). If a sensor is trying to measure only 1 nT or less, then it is obvious that the electronics of the sensor will "use up" the vast majority of its dynamic range responding to the large static geo-field, with little dynamic headroom left to measure much smaller, dynamic fields.

Referring to FIG. 1 there is illustrated a typical magnetic sensor 10 using a Giant Magneto-Impedance fiber 12. This sensor design represents one approach of several that is useful in displaying a magnetic field reading based on the magnetic field impressed upon the fiber 12. As is shown, there is a Giant Magneto-Impedance fiber 12 connected to a radio frequency signal source 14. The magnetic field (H) is impressed upon the fiber 12, as is the field from the bias coil 16 that is used to bias the fiber response in the linear, most sensitive region. The fiber 12 is connected to the input of an amplifier 18 and filter circuit 20 that has an output voltage that depends on the fiber's impedance. This is often implemented with operational amplifiers. At the output is an analog to digital converter 22 which digitizes the output voltage of the gain stage. The circuit design of magnetic sensor 10 illustrates that voltage is allowed to swing the entire range of the earth's geo-field (+/−60,000 nT) and illustrates the penalty in dynamic range that occurs from allowing the geo-field to overwhelm the sensor.

The analog to digital converter 22 has twenty bits of resolution, but the least significant bit represents 100 pT, or 0.1 nanoTesla, which will almost certainly get overwhelmed by system noise and will not be resolvable. The least significant bit will toggle between "0" and "1" and will not be usable. As a rule of thumb, the three least significant bits in an analog to digital converter can often be regarded as "down in the noise." It is generally desirable (if at all possible) to place the dynamic range of a measured signal into the upper half of the analog to digital converter range to reduce quantization noise effects. This technique has been used in "floating point analog to digital converters" and is mentioned here as an illustration to show the dynamic range problems created by the static geo-field.

There are other kinds of magnetic sensors designs in addition to sensor 10 illustrated in FIG. 1. Many of these magnetic sensor designs use a Giant Magneto-Impedance fiber to control the resonant frequency of an oscillator. The oscillator must be stable enough to resolve the magnetic field measurement without drifting so much that any magnetic change to be measured ("Delta H") is overwhelmed by the drift itself (See Hagerty, U.S. Pat. No. 7,405,559, Low-Power GMI Magnetic Detector That Utilizes a Crystal-Controlled Oscillator"). For any magnetic sensor, however, the same problem (i.e., dynamic range saturation) arises when confronted by the large static geo-field.

Referring to FIG. 2 there is illustrated an alternate magnetic sensor design 30 that includes geo-field nulling coils 34 for each axis fiber 40 (one each for the three axes) on the circuit board that are used to null out the earth's residual magnetic field. These geo-field nulling coils 34 are used instead of providing a separate Helmholtz coil, which would increase the size of the sensor assembly to approximately 2" in diameter. Each geo-field nulling coil 34 is driven by a digital to analog converter 36. The digital to analog converter 36 receives instructions from the microcontroller 38. Although nulling the earth's residual magnetic field is achieved through this design, there is a penalty. The penalty is a large, 3 dimensional magnetic device (about the size of a small sugar cube) wrapped around each axis fiber 40, putting a serious limitation on the amount of miniaturization possible with such a sensor. Manufacturing such a geo-field nulling coil 34 would be labor-intensive and expensive.

Where situations exist when separate geo-field nulling coils 34 are not an option due to limitations in size and costs, then an alternative geo-field nulling method for magnetic sensors is needed based on impedance compensation rather than magnetic compensation to cancel out undesired static offsets.

SUMMARY OF THE INVENTION

It is a general purpose and object of the present invention to provide a method for magnetic sensors to compensate for the earth's residual magnetic field.

This object is accomplished through the use of an impedance compensation method implemented with auxiliary electronic circuitry comprising a highly integrated impedance matching network that automatically nulls out the impedance change of a Giant Magneto-Impedance fiber that is caused by the geo-field.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
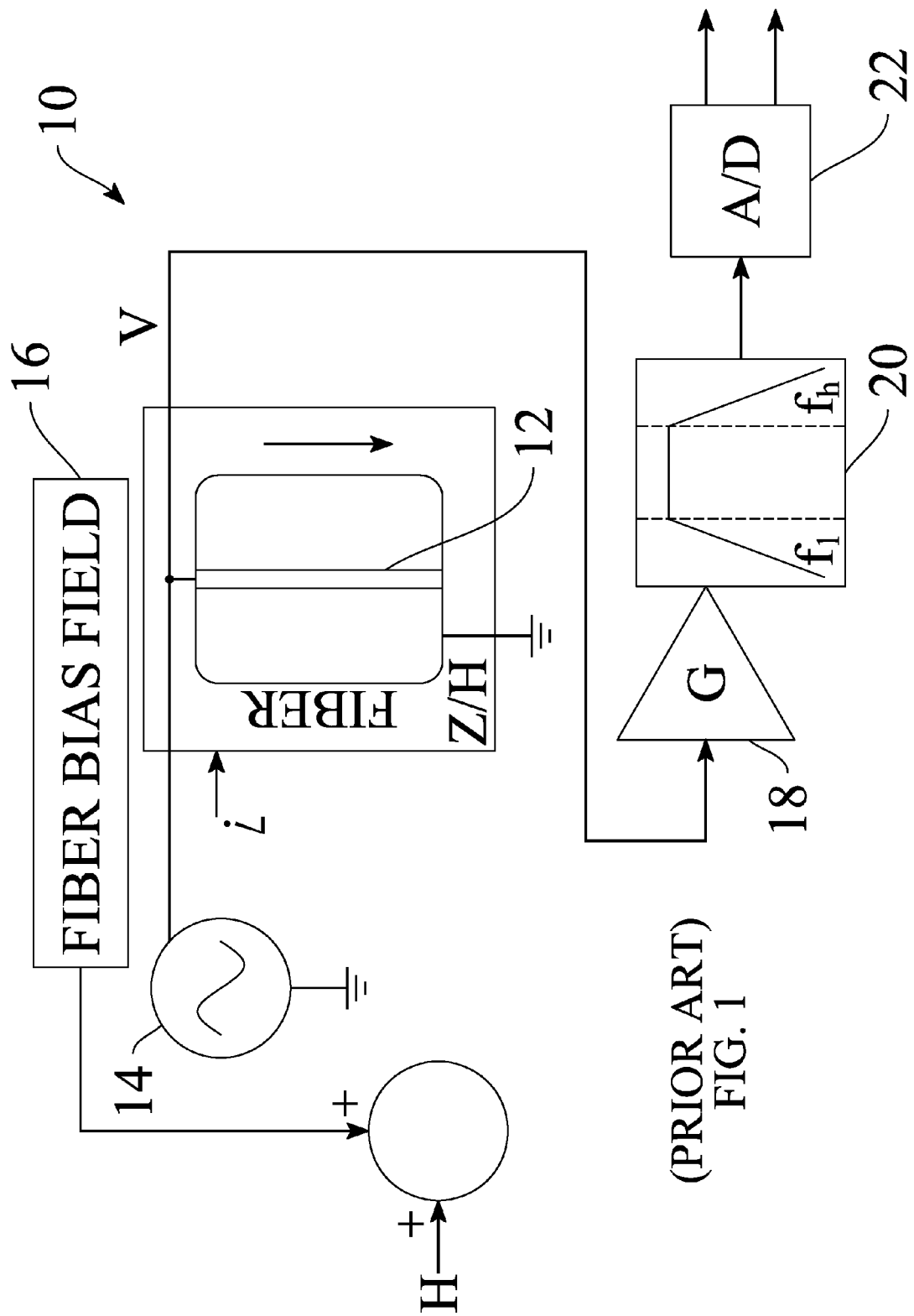
FIG. 1 is an exemplary circuit diagram/design of a prior art magnetic sensor with a GMI fiber.
Figure 2:
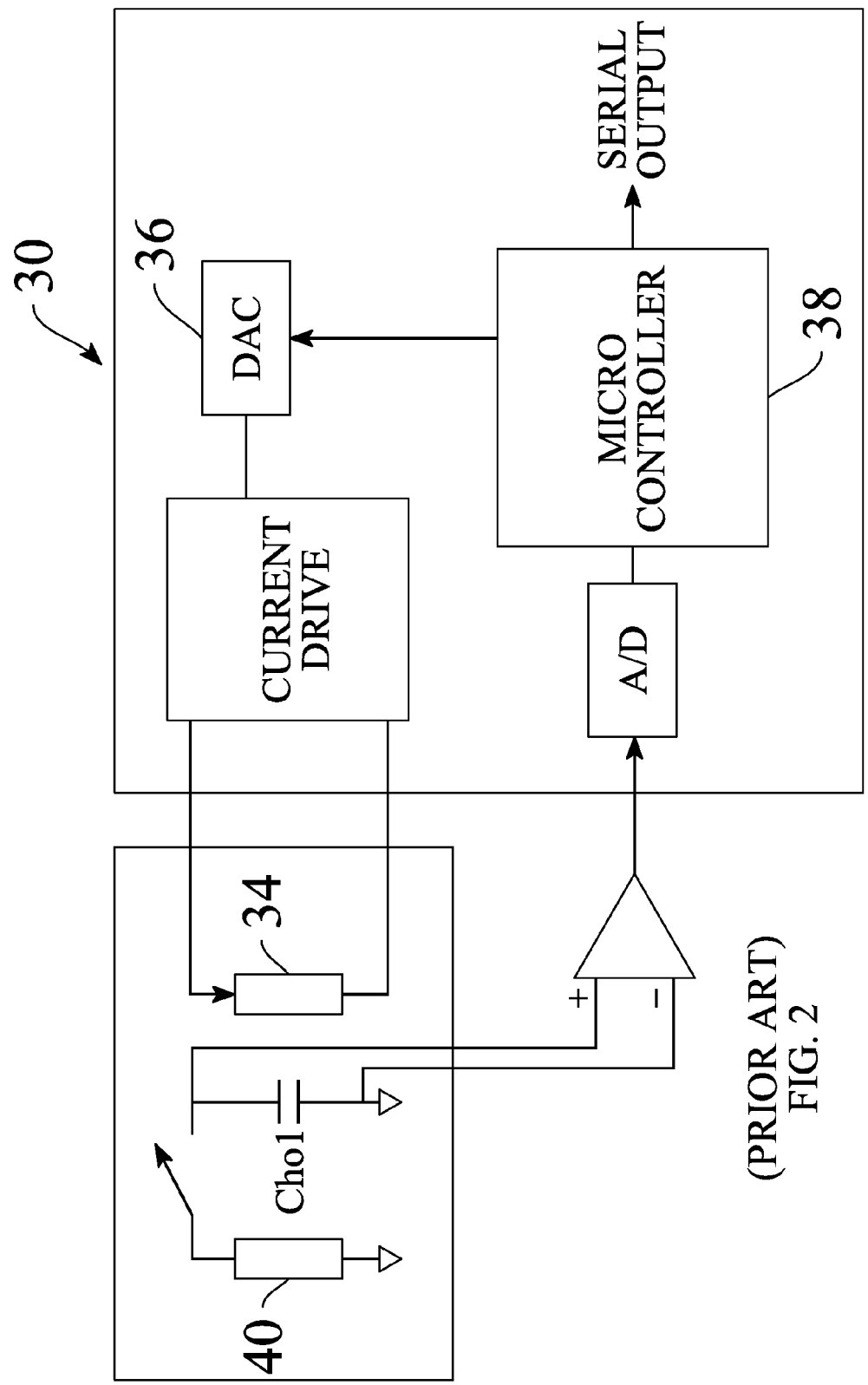
FIG. 2 is an exemplary circuit diagram of a prior art magnetic sensor using geo-field nulling coils.

The present invention teaches a method for use with a highly integrated impedance matching network that automatically nulls out the impedance change of the Giant Magneto-Impedance fiber 12 that is caused by the geo-field. The impedance matching is implemented with integrated circuitry electrically coupled as a modification component to a standard GMI magnetic sensor 45 (not shown but analogous to sensor 10 in FIG. 1). The impedance matching is performed in a manner very similar to the way an automatic antenna tuning unit matches an output amplifier stage's impedance to a given, unknown complex antenna load. Antenna tuning unit technology is now common and extremely well-developed. For example, a Pi-Network impedance matching circuit well known in the art of radio systems comprises two shunt variable capacitors $C_i$ and $C_o$ separated by a variable series inductor L. In the SGC manufactured SG-230 automatic antenna tuner, twenty six total network-selection relays can be switched in various combinations to give a network with sixty four values of input shunt $C_i$, thirty two values of output shunt $C_o$ and up to two hundred fifty six values of series L. Relays are used because of the high-power energy in the antenna system. The present invention uses a similar matching network, however, the relays are replaced with low-capacitance, solid-state switches as illustrated below. The desired components of Giant Magneto-Impedance fiber impedance matching network 42 are switched in or out of a general purpose tuning circuit 44 described below.

The implementation of a Giant Magneto-Impedance fiber impedance matching network 42 is simpler than implementing typical antenna tuning unit technology, because instead of impedance matching an unknown antenna load the tuning circuit 44 is impedance matching a well characterized Giant Magneto-Impedance fiber 12 whose reactive response to the static geo-field is accurately documented and measured a priori by the manufacturer.

Figure 3:
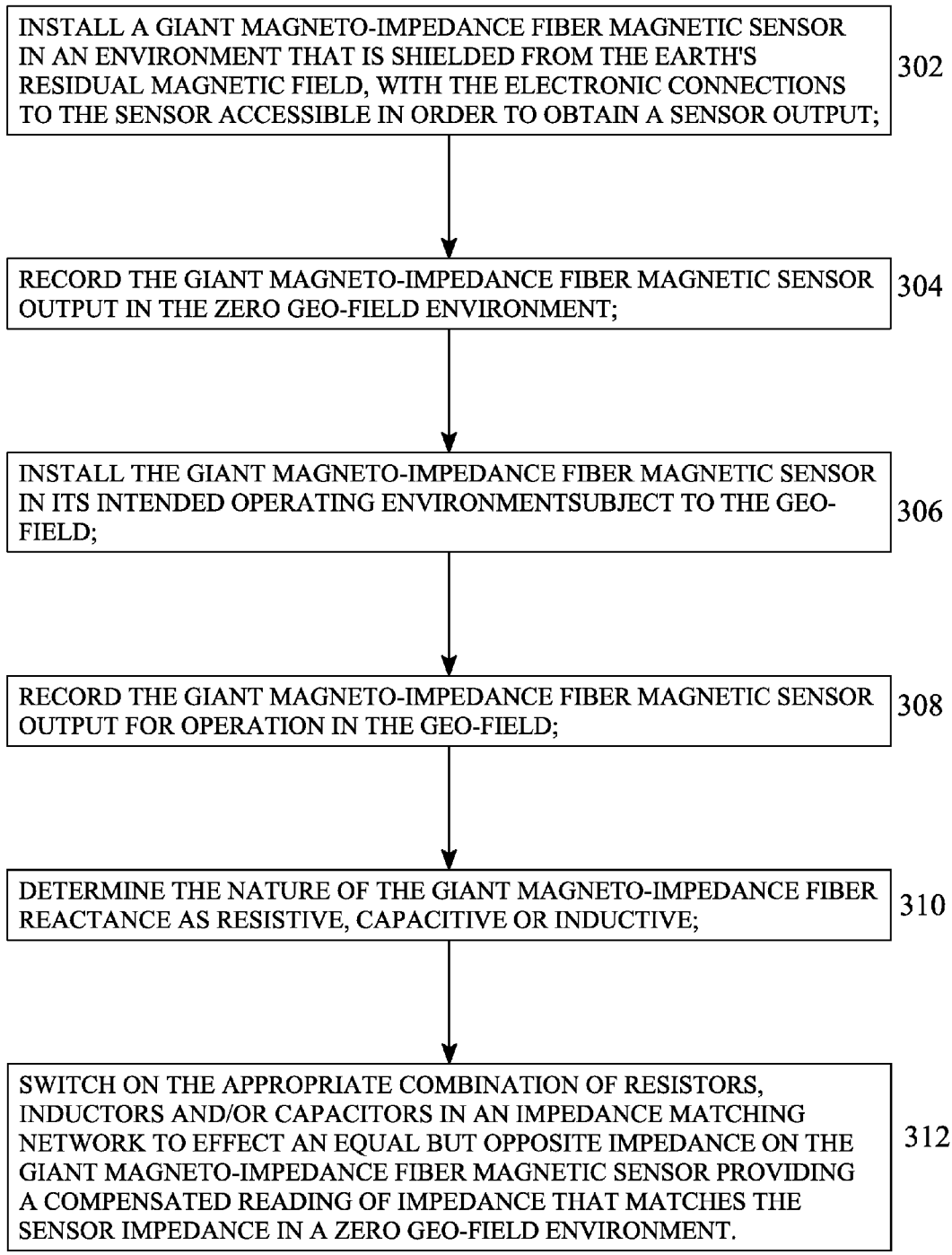
FIG. 3 is a flow chart of an impedance compensation method for a GMI magnetic sensor.

Referring to FIG. 3 there is illustrated a series of steps representing an impedance compensation method 300 for nulling the geo-field in a Giant Magneto-Impedance sensor 45. The first step 302 is to install a Giant Magneto-Impedance magnetic sensor 45 in an environment that shields the sensor 45 from the earth's residual magnetic field. In a preferred embodiment, the Giant Magneto-Impedance magnetic sensor 45 is installed in a mu-metal shield can (not shown), with the sensor's electronic connections accessible in order to obtain an output reading from the sensor 45. Shield cans made of mu-metal are well known in the magnetic sensor art and are used to block out the effects of magnetic fields. The sensor output is recorded in the zero (shielded) geo-field environment 304. At this point in the method, the impedance matching network 42 is not active. The GMI magnetic sensor 45 is then placed in its intended operating environment 306 where the geo-field can affect the sensor 45. The sensor output is recorded in the normal (unshielded) geo-field environment 308. A determination is then made of the nature of the GMI fiber reactance as resistive, capacitive, or inductive 310. In a preferred embodiment, a phase detector is used to make the determination. In the next step 312, based on the nature of the GMI fiber reactance, the appropriate series and parallel combinations of resistors, inductors and capacitors are switched on in the impedance matching network 42 to affect an equal but opposite compensating impedance upon the GMI fiber 12. This compensating impedance is equal to the difference between the GMI magnetic sensor output in a zero geo-field and the GMI magnetic sensor output in the actual geo-field. The impedance matching network 42 compensates for the geo-field impedance on the GMI fiber 12 essentially nulling the geo-field effect. Once the compensation occurs, the GMI magnetic sensor output is the same as when the sensor 45 was in a zero geo-field environment. Nulling out the impedance change caused by the geo-field places the response of the GMI magnetic sensor electronics in a condition where the sensor's remaining dynamic range to a small measured field can be better processed. From this point forward, magnetic field disturbances can be measured by the GMI magnetic sensor 45 as they occur.

Figure 4:
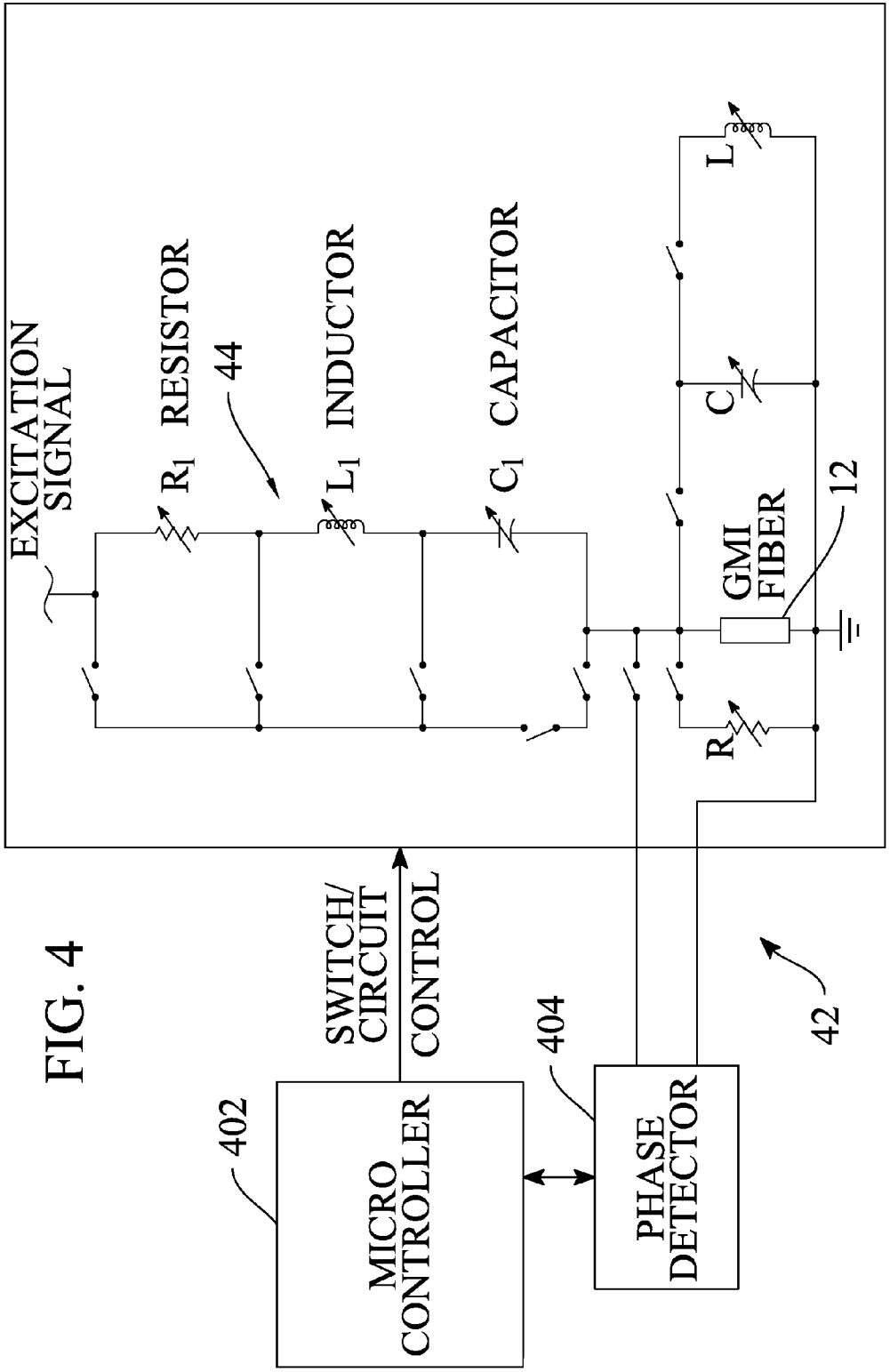
FIG. 4 is a circuit diagram of a matching network used to implement a method for impedance compensation for a GMI magnetic sensor.

Referring to FIG. 4 there is illustrated a diagram of a tuning circuit 44 referred to above for use in an impedance matching network 42 that can implement the above described impedance compensation method 300. An integrated microcontroller 402 manages the tuning process and switches in the appropriate components of the tuning circuit 400 according to established algorithms. Automatic antenna tuners utilize phase detectors during the matching process. In the present invention an integrated, ultra-low power phase detector 404 is switched into the GMI fiber circuit to measure and determine whether the reactance of the added geo-field has been equalized out. In all cases, the phase detector 404 should read the same after compensation as it did when the "zero geo-field" measurement was performed.

The complexity of the impedance matching network will depend on the type of reactance the GMI fiber 12 exhibits in the geo-field (as determined by the phase detector 404), as well as the magnitude of the impedance excursion under the geo-field. If (in the simplest case) the GMI fiber is only resistive and never becomes reactive in the geo-field, the microcontroller 402 switches in the appropriate combination of series and parallel resistors of the tuning circuit 44 such that the tuning circuit 44 consists of a digitally-controlled potentiometer, thereby restoring the resistance of the GMI fiber 12 to the resistance it exhibited in the zero geo-field environment.

If the GMI fiber reactance in the geo-field is inductive, then the microcontroller 402 switches in the appropriate combination of series and parallel capacitors (and possibly resistors) of the tuning circuit 44 such that the tuning circuit 44 nulls out the inductive reactance. The process of capacitor switching, where different combinations of capacitance are switched in and out to tune an electronic circuit is known in the art and is implemented on the microcontroller 402 according to established algorithms, using the available information from the manufacturer's impedance measurements on the GMI fiber 12. Integrated capacitors can be manufactured with high precision with a microscopic "footprint," suitable for the ultra-low power application described here. Surface-mount capacitors are readily available and are extremely small. In an alternative embodiment, another means of adjusting the tuning circuit capacitance is to use a varactor diode. However, these require a variable direct current voltage that must be included in the circuitry in such a way as to avoid disturbing the normal operation of the GMI fiber.

If GMI fiber reactance in the geo-field is capacitive, then the microcontroller 402 switches in the appropriate combination of series and parallel inductors (and possible resistors) of the tuning circuit 44 such that the tuning circuit 44 nulls out the capacitive reactance. The process of inductor switching, where different combinations of inductance are switched in and out to tune an electronic circuit is known in the art and is implemented on the microcontroller 402 according to established algorithms, using the available information from the manufacturer's impedance measurements on the GMI fiber. Surface-mount inductors are extremely small and can be switched in. Other new techniques for miniaturizing inductors using ultra-flat planar structures (i.e., thin metal coils deposited on insulating sheets or substrates) are available.

The advantages of the present invention, an impedance compensation method of nulling the geo-field in a Giant Magneto-Impedance magnetic sensor, over the prior art is the elimination of the large three dimensional magnetic compensation coil, which is expensive and labor-intensive to manufacture, thereby allowing miniaturization of the magnetic sensor. The present invention leverages algorithms, circuits, and techniques of field-proven, well-defined automatic antenna matching units on an ultra-low power (no more than milli-watts), miniaturized scale. The control algorithms of the microprocessor in the impedance matching network can be custom-tailored to the type of impedance changes that occur for manufacturer's specific fiber composition, making it less complex than that in an antenna tuner (which has to essentially match an unknown reactive load that can have large excursions). There is a great deal of suitability of incorporating the impedance matching network, control circuitry and switching components into an application-specific integrated circuit. Fabrication techniques for manufacturing ultra-low-profile, miniaturized planar inductors (including etching metal films on thin dielectric sheets) are becoming more practical for this purpose. The manufacturing is easier for capacitors and resistors. There is a lower cost to manufacture a matching network due to the use of readily-available, general-purpose RF components. Because there is no geo-field compensation magnetic coil wrapped around the fiber it is now fully exposed to the environment and therefore its capture sensitivity is preserved.

In light of the above, it is therefore understood that within the scope of the appended claims, the invention may be practiced otherwise than as specifically described.

What is claimed is:

1. An impedance tuning method to null the effect of the terrestrial residual magnetic field on a Giant Magneto-Impedance magnetic sensor having a Giant Magneto-Impedance fiber, comprising:
    installing a Giant Magneto-Impedance magnetic sensor in a zero geo-field environment, wherein one or more electronic connections connected to the Giant Magneto-Impedance magnetic sensor are accessible to obtain a sensor output;
    recording a first sensor output from the Giant Magneto-Impedance magnetic sensor in the zero geo-field environment;
    installing the Giant Magneto-Impedance magnetic sensor in an intended operating environment subject to a geo-field;
    recording a second sensor output from the Giant Magneto-Impedance magnetic sensor in the intended operating environment;
    making a determination of the nature of the Giant Magneto-Impedance fiber impedance in the Giant Magneto-Impedance magnetic sensor based on at least the first and second sensor outputs, wherein the nature of the reactance is categorized from three categories: resistive, capacitive, and inductive; and
    activating, based on the nature of the Giant Magneto-Impedance fiber impedance, a series and parallel combination of a plurality of resistors, inductors and capacitors in an impedance tuning circuit that is part of an impedance matching network comprised of integrated circuit components and electrically connected to said Giant Magneto-Impedance magnetic sensor, in order to affect a compensating impedance that is equal but opposite to an impedance represented by the difference between the first and second sensor outputs.

2. The method of claim 1 wherein making a determination of the nature of the Giant Magneto-Impedance fiber impedance in the Giant Magneto-Impedance magnetic sensor is accomplished through the use of a phase detector electrically joined to said Giant Magneto-Impedance magnetic sensor.

3. The method of claim 1 wherein the zero geo-field environment is a mu-metal shield can.

4. The method of claim 1 wherein the impedance matching network includes a microprocessor that receives the determination of the nature of the Giant Magneto-Impedance fiber impedance and is programmed with a plurality of algorithms to perform the switching of the appropriate series and parallel combinations of the plurality of resistors, inductors and capacitors in the impedance turning circuit based on the nature of the Giant Magneto-Impedance fiber impedance.

5. The method of claim 4 wherein when the nature of the Giant Magneto-Impedance fiber impedance is determined to be resistive the microcontroller switches the appropriate combination of series and parallel plurality of resistors of the impedance tuning circuit such that the resistance of the GMI fiber is restored to the resistance it exhibited in the zero geo-field environment.

6. The method of claim 4 wherein when the nature of the Giant Magneto-Impedance fiber impedance is determined to be inductive, the microcontroller switches the appropriate combination of series and parallel integrated plurality of capacitors and resistors of the impedance tuning circuit such that the impedance tuning circuit nulls the inductive impedance.

7. The method of claim 4 wherein when the nature of the Giant Magneto-Impedance fiber impedance is determined to be capacitive, the microcontroller switches in the appropriate combination of series and parallel integrated plurality of inductors and resistors of the impedance tuning circuit such that the impedance tuning circuit nulls the capacitive impedance.

8. An impedance tuning method to null the effect of the terrestrial residual magnetic field on a Giant Magneto-Impedance magnetic sensor having a Giant Magneto-Impedance fiber, comprising:
    installing a Giant Magneto-Impedance magnetic sensor in a mu-metal shield can that creates a zero geo-field environment, wherein one or more electronic connections connected to the Giant Magneto-Impedance magnetic sensor are accessible to obtain a sensor output;
    recording a first sensor output from the Giant Magneto-Impedance magnetic sensor in the zero geo-field environment;
    installing the Giant Magneto-Impedance magnetic sensor in an intended operating environment subject to a geo-field;

recording a second sensor output from the Giant Magneto-Impedance magnetic sensor in the intended operating environment;

making a determination of the nature of the Giant Magneto-Impedance fiber impedance in the Giant Magneto-Impedance magnetic sensor based on at least the first and second sensor outputs and the use of a phase detector electrically joined to the Giant Magneto-Impedance fiber, wherein the nature of the impedance is categorized from one of three categories: resistive, capacitive, and inductive;

activating, based on the nature of the Giant Magneto-Impedance fiber impedance, a series and parallel combination of a plurality of resistors, inductors and capacitors based on the nature of the Giant Magneto-Impedance fiber impedance in an impedance tuning circuit that is part of an impedance matching network comprised of integrated circuit components and electrically connected to said Giant Magneto-Impedance magnetic sensor, in order to affect a compensating impedance that is to an impedance represented by the difference between the first and second sensor outputs, wherein a microprocessor that is part of said impedance matching network and is electrically joined to said phase detector is programmed with a plurality of algorithms for switching the appropriate series and parallel combinations of a plurality of resistors, inductors and capacitors based on the nature of the Giant Magneto-Impedance fiber impedance determination it receives from said phase detector; and after activating said series and parallel combination of a plurality of resistors, inductors, and capacitors based on the nature of the Giant Magneto-Impedance fiber impedance, measuring at least one magnetic field disturbance as it occurs.

9. The method of claim 8 wherein when the nature of the Giant Magneto-Impedance fiber impedance is determined to be resistive the microcontroller switches the appropriate combination of series and parallel plurality of resistors of the impedance tuning circuit such that the resistance of the GMI fiber is restored to the resistance it exhibited in the zero geo-field environment.

10. The method of claim 8 wherein when the nature of the Giant Magneto-Impedance fiber impedance is determined to be inductive, the microcontroller switches the appropriate combination of series and parallel integrated plurality of capacitors and resistors of the impedance tuning circuit such that the impedance tuning circuit nulls the inductive impedance.

11. The method of claim 8 wherein when the nature of the Giant Magneto-Impedance fiber reactance is determined to be capacitive, the microcontroller switches in the appropriate combination of series and parallel integrated plurality of inductors and resistors of the impedance tuning circuit such that the impedance tuning circuit nulls the capacitive impedance.

* * * * *